Figure 1:
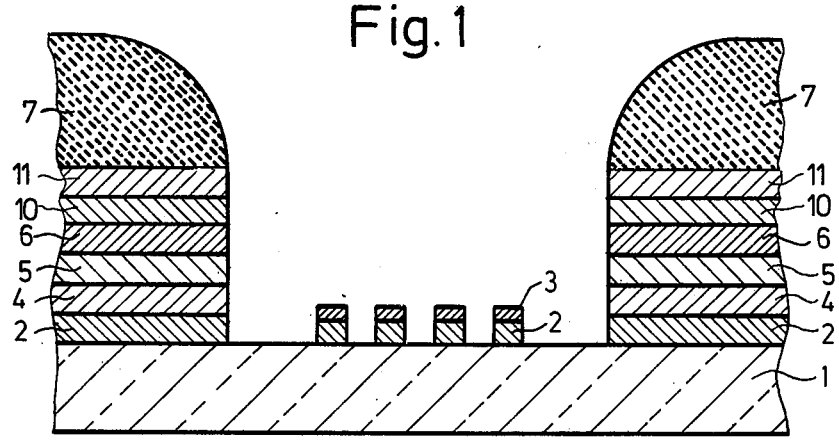

United States Patent [19]
Küttner et al.

[11] 4,075,416
[45] Feb. 21, 1978

[54] ELECTRONIC THIN FILM CIRCUIT UNIT AND METHOD OF MAKING THE SAME

[75] Inventors: Klaus Küttner, Stuttgart; Günter Krüger, Leonberg; Fedor Modic, Stuttgart, all of Germany

[73] Assignee: Robert Bosch GmbH, Stuttgart, Germany

[21] Appl. No.: 652,728

[22] Filed: Jan. 27, 1976

[30] Foreign Application Priority Data

Mar. 7, 1975 Germany .............................. 2509912

[51] Int. Cl.² ................................................ H05K 1/00
[52] U.S. Cl. ..................................... 174/68.5; 361/397
[58] Field of Search ................ 174/68.5; 317/101 CC, 317/101 CP, 101 C, 101 B

[56] References Cited

U.S. PATENT DOCUMENTS

| | | | |
|---|---|---|---|
| 3,423,260 | 1/1969 | Heath et al. | 174/68.5 X |
| 3,576,722 | 4/1971 | Fennimore et al. | 174/68.5 X |
| 3,621,442 | 11/1971 | Racht | 174/68.5 |
| 3,625,758 | 12/1971 | Stahl et al. | 174/68.5 X |
| 3,634,159 | 1/1972 | Croskery | 174/68.5 X |
| 3,778,530 | 12/1973 | Reiman | 174/68.5 |
| 3,781,596 | 12/1973 | Galli et al. | 174/68.5 X |
| 3,809,797 | 5/1974 | McMunn et al. | 174/68.5 X |

OTHER PUBLICATIONS

IBM Technical Disclosure, Segmented Stripe Devices, vol. 13, No. 7, Dec. 1970, p. 2011.

*Primary Examiner*—Arthur T. Grimley
*Attorney, Agent, or Firm*—Flynn & Frishauf

[57] ABSTRACT

After a valve metal layer on an insulating substrate has been metallized by sputtering on two layers of copper separated by an intermediate layer of iron, nickel or cobalt, and the combined circuit and component pattern has been etched out, followed by selectively etching away the metallization over the resistance components of the circuit, electroless deposited nickel and gold layers are successively applied to the remaining metallization and a solder layer is then applied on top by contact with liquid solder.

7 Claims, 11 Drawing Figures

ELECTRONIC THIN FILM CIRCUIT UNIT AND METHOD OF MAKING THE SAME

This invention relates to a thin film electronic circuit unit having an insulating substrate plate partly covered with a layer of a valve metal disposed thereon with a first and a second pattern, the first and second valve metal patterns being contiguous in one or more places. The first pattern of the valve metal layer defines the circuit elements and the second pattern defines the connection paths and the contact areas. The valve metal layer throughout the second pattern is provided with metallization comprising a first copper layer, an intermediate layer of a diffusion barrier metal on top of the first copper layer and a second copper layer on top of the intermediate layer. A soft solder layer is applied on top of the metallization.

An electronic thin film circuit unit of the type above described has already been disclosed, in German published Pat. Application (OS) 2 155 829, corresponding to U.S. Pat. No. 3,872,356, in which the soft solder layer is applied directly on the outer second copper layer of a three-layer metallization system. Such electronic thin film circuit units, however, have the disadvantage that the second copper layer does not allow itself to be coated with the soft solder with sufficient reliability when the soft solder is applied in a reducing atmosphere of a protective gas without the use of a flux, because minute oxide residues on the second copper layer interfere with the coating process.

It is an object of the present invention to overcome the disadvantages of the electronic thin film circuit units of the general type described in the foregoing introduction.

SUMMARY OF THE INVENTION

Briefly, a five-layer metallization is provided for the portion of the valve metal layer forming the second pattern, by applying a nickel layer on the second copper layer and applying a gold layer on the nickel layer. The nickel layer so applied prevents solution of copper of the second copper layer in the soft solder layer when liquid solder is applied, whereas the gold layer improves the wettability of the metallization by liquid solder and thereby notably increases the adhesion of the soft solder layer.

Figure 2A:
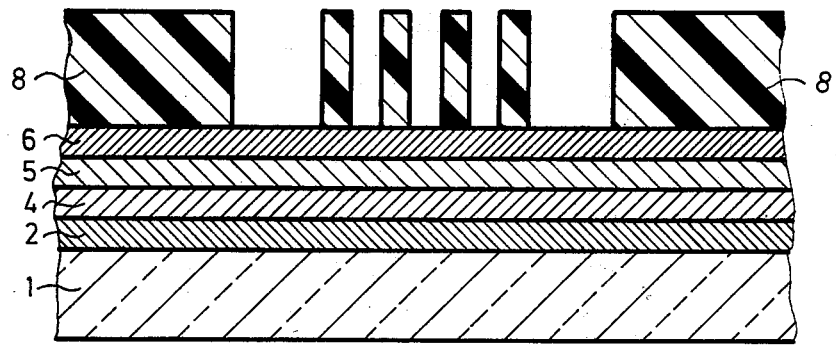
Figure 2B:
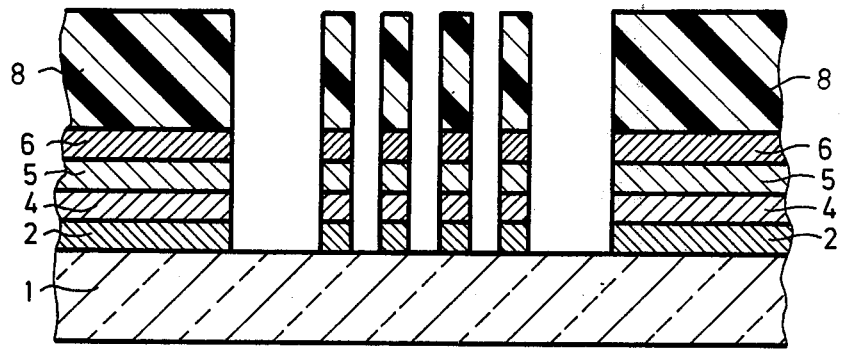
Figure 2C:
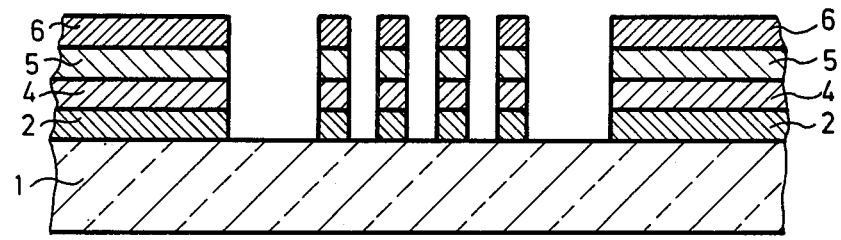
Figure 2D:
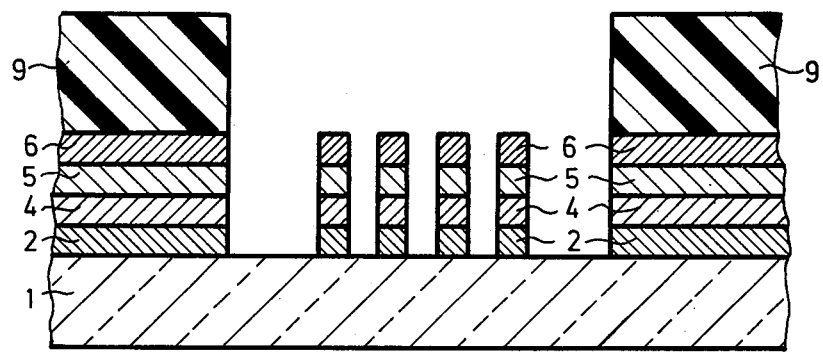

The invention is further described by way of example, in both its process and product aspects, with reference to the annexed drawings, in which:

FIG. 1 is a cross-section of a portion of an electronic thin film circuit unit according to the invention which contains a resistance network, and FIGS. 2a, 2b, . . . 2k show successive stages of the manufacture of the electronic thin film circuit unit of FIG. 1 in accordance with the invention, in each case likewise in partial cross-section.

FIG. 1 shows a carrier plate 1 of an insulating substrate material on which there has been provided a layer 2 of a valve metal of a thickness of 1000 A, in a surface pattern corresponding to the particular shape required for a circuit network. By a valve metal is meant a metal that forms an oxide capable of blocking direct current. The valve metal used is preferably tantalum. Instead of tantalum, however, there may be used niobium, aluminum, zirconium or hafnium.

The valve metal layer 2 has, on that portion of its surface that forms the resistance network, an oxide layer 3 that is produced by partial anodic oxidation of the valve metal layer at these locations. At other portions of its surface, which do not belong to the resistance network, the valve layer metal 2 is provided with metallization consisting of five layers 4, 5, 6, 10, 11. The first layer 4 and the third layer 6 of this metallization are both copper layers of 2000 A thickness. The intermediate layer 5 lying between the copper layers 4 and 6 consists of a metal having the effect of a diffusion barrier, for example a layer of iron, nickel or cobalt. The thickness of this layer 5 is about 4000 A.

On top of the upper copper layer 6 is a nickel layer 10, and on this nickel layer there is a gold layer 11. The nickel layer 10 has a thickness of 5000 A and the gold layer a thickness of 1000 A. The thicknesses given are illustrative of the preferred embodiments in which economy is achieved by avoiding unnecessary thickness of the various layers. The particular thickness is not critical and the thickness necessary for the function of each of the various layers is readily ascertained and follows principles known in the art. The five-layer metallization consisting of the layers 4, 5, 6, 10 and 11 is provided in all places on the valve metal layer 2 that are intended to serve as connection paths and as contact areas for external contacts. A solder layer 7 consisting of a lead-tin eutectic alloy is provided on top of the metallization consisting of the layers 4, 5, 6, 10 and 11. The solder layer 7, together with the layers 4, 5, 6, 10 and 11 and also the underlying portions of the valve metal layer 2 forms both the connection conductors and the solderable connection contacts that serve for externally contacting the electronic thin film unit and/or for connecting additional components. In the case of thin film circuits completed by adding additional components thus soldered into the circuit, the completed unit is generally referred to as a thin film hybrid unit. The portions of the valve metal layer 2 which are not covered by the layers 4, 5, 6, 10, 11 and 7 but rather with the oxide layer 3 form the resistance network of the thin film circuit unit or thin film hybrid circuit unit as the case may be.

FIGS. 2a through 2k show the thin film circuit unit of FIG. 1 at various stages of its manufacture in accordance with the present invention. First, an overall layer 2 of a valve metal is applied to the carrier plate 1 by cathodic sputtering. On top of this layer 2, the metal layers 4, 5 and 6 are successively applied, likewise as overall layers, by cathodic sputtering. A photoresist mask 8 is then applied in the usual way to the carrier plate on top of the layers above described, being exposed and developed so as to cover the layer system 2, 4, 5, 6 only in the places where the valve layer metal 2 is required for the completed unit. These areas include all the regions that are designed to form resistance elements, connection paths or connection contact places, which is to say, all the regions which form the basic geometry of the thin film circuit. The mask 8 leaves uncovered, therefore, those regions where the surface of the insulating substrate 1 should again be exposed.

Accordingly, the carrier plate 1, provided with the layers 2, 4, 5 and 6 and also with the photoresist mask 8, which may also be referred to as a photolithographic mask, is first immersed in a mixture of hydrofluoric acid, nitric acid and water, and the basic geometrical pattern of the circuit network is etched out with the result shown in FIG. 2b. When the mask 8 has thus served its purpose, the substrate with its layered circuit pattern is then dipped in acetone in order to dissolve away the photoresist mask 8 with the result shown in FIG. 2c.

Figure 2E:
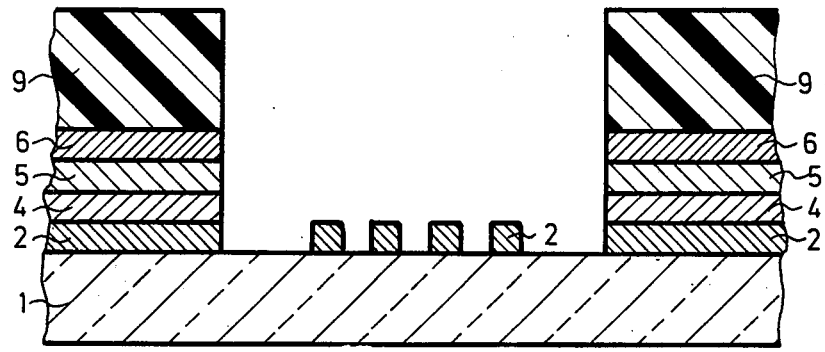

Next, a pattern-separating mask 9 is applied, preferably by a silk screen printing process well known in the art that does not need to be further described. In this case, all the portions of the patterned layers where resistances are to be formed are left uncovered. The carrier plate 1, provided with the now patterned layer system 2, 4, 5, 6 and also with the pattern separating mask 9 is immersed in an aqueous solution of nitric acid which selectively etches away the layers 4, 5, and 6 at the places not covered by the pattern separating mask 9 and leaves the valve metal layer 2 exposed in these places, as shown in FIG. 2e, since the valve metal layer 2 is not attacked by this etchant.

Figure 2F:
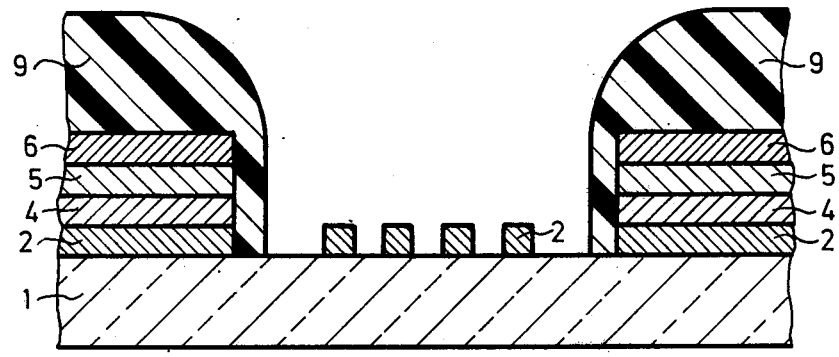
Figure 2G:
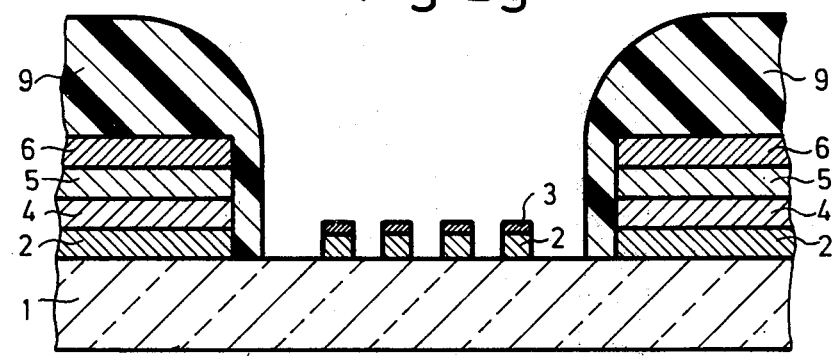

The unit, with the screen printed mask 9 still adhering to it, is then warmed to a temperature of 130° C. As the result of this warming, the picein resin constituting the screen printed mask 9 is brought to a state in which it begins to flow and spreads itself a little by spilling over the etched edges down onto the upper surface of the carrier plate or, as the case may be, onto the valve metal layer. FIG. 2f shows the carrier plate 1 with the patterned layer system 2, 4, 5, 6 and the screen printed mask 9 after warming to 130° C. The spilling over can be clearly seen from this figure.

Next the ohmic resistance of the resistance network consisting of the portions of the valve metal layer that have been exposed by etching is adjusted to the desired value by partially converting the layer into an oxide layer 3 at its upper surface by anodic oxidation. During this step, the screen printed mask 9 that has spread itself a little over the etching boundaries of the metallization layers 4, 5 and 6 down onto the exposed surface of the substrate or of the valve metal layer 2, as the case may be, provides an excellent protection for the connection paths and for the connection contacts against attack by the electrolyte. If, in spite of this protection, on account of a defect in the screen printed mask, a connection conductor or a contact area should be exposed at any place, an oxide having the property of healing the short-circuit is formed as soon as the electrolyte comes into contact with the susceptible metals, according to the following equations:

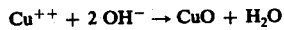

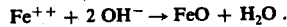

Figure 2H:
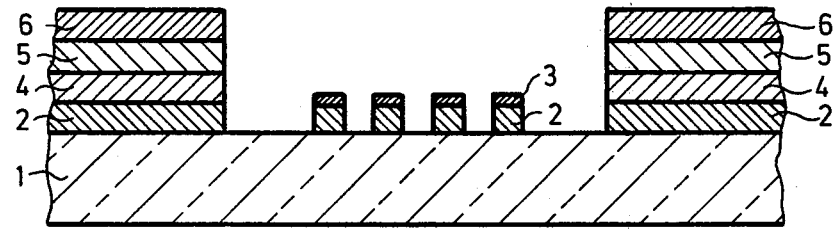
Figure 2:
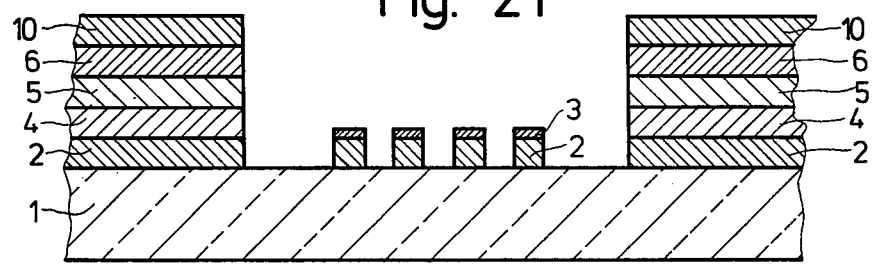
Figure 2K:
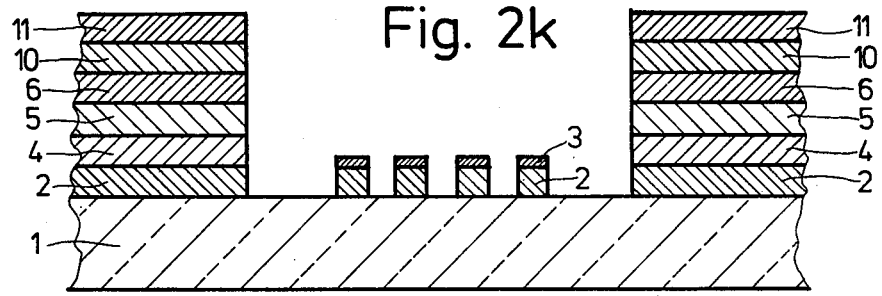

After the anodic oxidation, the screen printed mask 9 is removed by immersing the system 1, 2, 3, 4, 5, 6, 9 in trichlorethylene. The remaining structure 1, 2, 3, 4, 5, 6 shown in FIG. 2h is then immersed in an aqueous solution containing, as its principal reagents, nickel chloride and sodium hypophosphite. This solution produces electroless deposition of a nickel layer 10 on the upper copper layer 6 as shown in FIG. 2i, while the valve metal oxide layer 3 remains free of nickel. Then a thin gold layer 11 is applied on the nickel layer 10. The deposition of the gold is produced in a gold plating solution (sudgoldlosung) at a temperature between 60° and 95° C. A portion of the baser metal nickel then goes into solution while the chemically equivalent amount of gold is deposited (see FIG. 2k). The structure so produced, illustrated in FIG. 2k, composed of the substrate 1 and the layers 2, 3, 4, 5, 6, 10 and 11, is then dipped in liquid solder consisting of a lead-tin eutectic composition, without the use of any flux. The liquid solder does not wet the valve metal resistance paths 2 that are covered with the oxide layer 3. On the other hand, the surface of the metallization 4, 5, 6, 10, 11 is wet by the liquid solder and a solder layer 7 is formed, so that the structure illustrated in FIG. 1 results, corresponding to the completed thin film circuit unit. The solder layer 7, instead of being provided by dipping, can also be applied by the so-called "wave" soldering process, in which a wave of liquid solder passes in contact over the down-turned surface of the substrate which bears the patterned structure.

The unit thus manufactured, shown in FIG. 1 and having the layer system 1, 2, 3, 4, 5, 6, 10, 11, 7, provides an electronic thin film circuit unit having a network of resistances, the resistances consisting of valve metal, and having connecting conductors and contact areas consisting of a layer of valve metal and a five-layer metallization applied thereto, with a lead-tin soft solder layer on top of the five-layer metallization. The metallization system contains two layers operating as diffusion barriers, namely the intermediate layer 5 lying between the two copper layers, that consists of iron, nickel or cobalt, and the nickel layer 10 that lies under the gold layer. Both diffusion barrier layers 5 and 10 have the ability to prevent diffusion across them of metal from one of the adjoining layers into the other.

The provision of the solder layer 7 substantially increases the electrical conductivity of the connecting conductors.

If trimming or adjustment of the resistance value of the resistance layer 2 consisting of valve metal is not necessary, the provision of the layer 3 can be omitted and, in consequence, the process step of anodically oxidizing the valve layer 2 is then dispensed with.

Instead of the valve metal layer 2, there can be used as the resistance layer a layer of valve metal nitride, for example a layer of tantalum nitride, or a valve metal oxynitride layer, for example a layer of tantalum oxynitride. Such layers can form circuit components of an electronic thin film circuit unit in the same way and can be anodically oxidized in the same way as valve metal layers. It can thus be seen that although the invention has been described in detail with reference to a particular embodiment, variations are possible within the inventive concept.

We claim:

1. In a thin film electronic circuit unit comprising a substrate plate of insulating material, a patterned layer of a valve metal partly covering the substrate plate in accordance with a first and a second pattern, said first and second patterns being contiguous to each other in at least one location and respectively defining a first and a second portion of said valve metal layer, said first portion providing circuit elements and said second portion providing connecting conductors and areas for external contact and being provided with metallization, said metallization of said second valve metal layer portion including a first copper layer (4) on top of said valve metal layer, an intermediate layer (5) of a diffusion barrier metal on top of said first copper layer and a second copper layer (6) on top of said diffusion barrier metal layer, and a soft solder layer (7) provided on top of said metallization, the improvement wherein:

said metallization further comprises five layers (4, 5, 6, 10, 11) of which one is a nickel layer (10) located on top of said second copper layer (6) and another is a gold layer (11) superimposed on said nickel layer (10).

2. Improvement in a thin film circuit unit as defined in claim 1, wherein a layer of valve metal oxide (3) is provided on top of said first portion of said valve metal layer (2) and the thickness of said first portion of said valve metal layer is less than that of said second portion by an amount equal to the thickness of said valve metal oxide layer (3).

3. Improvement in a thin film circuit unit as defined in claim 1, in which said intermediate layer (5) between the first and second copper layers is of iron.

4. Improvement in a thin film circuit unit as defined in claim 1, in which said intermediate layer (5) between the first and second copper layers is of nickel.

5. Improvement in a thin film circuit unit as defined in claim 1, in which said intermediate layer (5) between the first and second copper layers is of cobalt.

6. Improvement in a thin film circuit unit as defined in claim 1, in which said valve metal layer is of tantalum.

7. Improvement in a thin film circuit unit as defined in claim 1, in which said soft solder layer (7) is of lead-tin solder.

* * * * *